United States Patent [19]

Ivory et al.

[11] Patent Number: 5,750,291
[45] Date of Patent: May 12, 1998

[54] IMAGE-FORMING PROCESS

[75] Inventors: Nicholas Eric Ivory, Glastonbury; Wrenford John Thatcher, Frome, both of England

[73] Assignee: Coates Brothers PLC, England

[21] Appl. No.: 662,309

[22] Filed: Jun. 13, 1996

Related U.S. Application Data

[62] Division of Ser. No. 351,137, Nov. 30, 1994, Pat. No. 5,556,735, which is a continuation of Ser. No. 960,422, filed as PCT/GB91/01046 Jun. 27, 1991 published as WO92/0052 Jan. 9, 1992., abandoned.

[30] Foreign Application Priority Data

Jun. 27, 1990 [GB] United Kingdom .................. 9014325
Mar. 27, 1991 [GB] United Kingdom .................. 9106561

[51] Int. Cl.$^6$ .................................................. G03F 7/00
[52] U.S. Cl. ............................ 430/11; 427/96; 118/125
[58] Field of Search .................................. 430/311, 313, 430/315, 319, 324, 327, 396, 11; 427/96; 118/125

[56] References Cited

U.S. PATENT DOCUMENTS

| | | | |
|---|---|---|---|
| 4,154,614 | 5/1979 | Tsunoda | 430/157 |
| 4,592,816 | 6/1986 | Emmons | 430/327 |
| 5,093,223 | 3/1992 | Iwasawa | 430/330 |

FOREIGN PATENT DOCUMENTS

| | | |
|---|---|---|
| 30213 | 6/1981 | European Pat. Off. . |
| 83835 | 7/1983 | European Pat. Off. . |
| 288153 | 10/1988 | European Pat. Off. . |
| 665649 | 1/1952 | United Kingdom . |
| 719084 | 11/1954 | United Kingdom . |
| 1373862 | 11/1974 | United Kingdom . |
| 1478381 | 6/1977 | United Kingdom . |
| 2013918 | 8/1979 | United Kingdom . |
| 89-07785 | 8/1989 | WIPO . |

*Primary Examiner*—Kathleen Duda
*Attorney, Agent, or Firm*—Wigman, Cohen, Leitner and Myers, P.C.

[57] ABSTRACT

A process for the formation of a patterned resist of a photocurable material on a circuit board, the uncured portion of which is water soluble. The process includes the steps of forming a layer of an aqueous emulsion of a photocurable material upon the circuit board, drying the layer to a substantially dry and non-tacky state, imagewise exposing the layer to radiation to cure portions of the layer exposed to the radiation, and removing unexposed portions of the layer by washing with water. In a preferred embodiment, the photocurable material is an organic solvent solution of an epoxy acrylate derived from an epoxy novolac resin which has been carboxylated to render it alkali-developable.

2 Claims, No Drawings

IMAGE-FORMING PROCESS

This is a divisional of application Ser. No. 08/351,137, filed Nov. 30, 1994, now U.S. Pat. No. 5,556,735, which in turn is a file wrapper continuation of application Ser. No. 07/960,422, filed on Dec. 23, 1992, now abandoned, filed as PCT/GB91/01046 on Jun. 27, 1991, published as WO92/0052 on Jan. 9, 1992.

This invention is concerned with the formation of patterned images upon substrates. More particularly, the invention is concerned with process for producing patterned images, using so-called "photoresists" on printed circuit boards and like electronic components, during the course of their manufacture.

The use of photoresists in the course of manufacture of printed circuit boards and the like, is well-known and well-established. Basically, the process comprises forming a layer of a photoresist material (or, simply, "resist") upon an appropriate substrate; patternwise exposing the layer to radiation; and then "developing" the exposed layer by removal of uncured portions of the layer not exposed to the radiation (in the case of so-called negative working results). In particular, a photoresist technique is used to produce patterned images for selective etching of a metal substrate, for the plating of a metal upon a substrate, and for the application of a solder to a substrate.

To date, two main classes of resist have been generally used, namely dry-film resists and liquid resists. Dry film resists essentially comprise a solid film of photocurable material which, in use, is laminated to the desired substrate and subsequently exposed to radiation and cured. Dry film resists afford resists layer with good definition but require more complex processing and apparatus than do liquid resists, which may be applied to a substrate by any suitable film coating technique. Two basic classes of liquid photocurable resist materials are known, each comprising a solution of an ethylenically unsaturated photo-polymerisable material, together with an appropriate photo-initiator, in an organic solvent system. In one case, the organic solvent system is itself formed of relatively low molecular weight unsaturated compounds (reactive diluents) which, upon curing, may become fully incorporated in the cured film. In the other case, the solvent systems comprise volatile organic solvents (non reactive diluents) which are evaporated or dried off from the coating after application to a substrate to afford a relatively dry and non-tacky film (which cannot be obtained using reactive diluent systems).

Currently, in the manufacture of printed circuit boards and the like, a preferred technique is a so-called "photoimaging" technique in which a patterned mask is placed directly in contact with the layer of resist on the substrate, the resist layer then being exposed to radiation through the mask. This technique affords good definition and resolution but can only be carried out with resist layers which are generally non-tacky, e.g. those prepared from compositions containing volatile organic solvents. However, the use of volatile organic solvents involves well-known hazards and environmental disadvantages.

It has now been found, in accordance with the present invention, that a resist layer may be formed upon a substrate by applying thereto an aqueous emulsion of a photocurable material and allowing the layer to dry by evaporating off water.

Basically, therefore, the present invention provides a process for the formation of a patterned image upon a substrate which comprises the steps of:

(i) forming a layer of an aqueous emulsion of a photocurable material upon the substrate;

(ii) drying the layer to a substantially dry and non-tacky state;

(iii) imagewise exposing the layer to radiation to cure (harden) portions of the layer exposed to the radiation; and exposed to radiation through the mask. This technique affords good definition and resolution but can only be carried out with resist layers which are generally non-tacky, e.g. those prepared from compositions containing volatile organic solvents. However, the use of volatile organic solvents involves well-known hazards and environmental disadvantages.

It has now been found, in accordance with the present invention, that a resist layer may be formed upon a substrate by aplying thereto an aqueous emulsion of a photocurable material and allowing the layer to dry be evaporating off water.

Basically, therefore, the present invention provides a process for the formation of a patterned resist upon a printed circuit board which comprises the steps of:

(i) forming a layer of an aueous emulsion of a photocurable material upon the board;

(ii) drying the layer to a substantially dry and non-tacky state;

(iii) imagewise exposing the layer to radiation to cure (harden) portions of the layer exposed to the radiation; and (iv) removing unexposed (uncured) portions of the layer by washing with water.

The photocurable material present in the emulsions used in accordance with the invention will generally comprises two components, namely a photoinitiator component, which on exposure to appropriate radiation, induces or causes curing of the other, curable component. A wide variety of such photo- curable systems are known.

One general class of photocurable systems comprises a curable reactive material (generally oligomeric or polymeric in nature) together with an initiator component which, on exposure to the appropriate radiation, reacts with the curable component thereby to cross-link it or cure it. Another general class of photocurable system comprises an ethylenically unsaturated curable material (again generally oligomeric or polymeric in nature) together with a photoiniator which, on exposure to the appropriate radiation, gives rise to free radicals which initiate polymerisation of the double bonds in the curable component.

A particular embodiment of the first general class of photocurable system comprises polyvinyl alcohol as curable component together with a diazo initiator In addition to these two components and, of course, water, such a composition desirably also contains polyvinyl acetate which, whilst not cured on exposure of the system to radiation, serves to improve the general solvent resistance of the finally cured film. Typically, such a composition will comprise 11 to 15% by weight of polyvinyl alcohol, 20 to 27% by weight of polyvinyl acetate, water (deionised water) in an amount of from 54 to 61% by weight, and diazo activator in an amount of from 0.4 to 0.6% by weight. Minor amounts of other ingredients may be present including plasticisers, pigments, degasing agents, etc. The emulsions are simply prepared by combining the ingredients together and forming an emulsion by high speed stirring. Suitable diazo sensiter for use in the above system may be anionic complexes of 1-diazo-diphenylamine/paraformaldehyde condensates with sulphuric acid salts, phosphoric acids and zinc chloride double salts. Suitable diazo resins may be made by condensing the diazotisation products of diphenylamines (such as p-aminodiphenylamine, 4-amino-4'-ethyl-diphenylamine or 4-amino-4'-nitro-diphenylamine) with aldehydes such as methanal, ethanal and propanal to yield a water soluble product.

Photocurable materials which may be used in the second general class of photocurable systems are multifunctional acrylate oligomers such as pentaerythritol triacrylate, trimechyloloropane triacrylate, trimethylolethane trimethacrylate and ethylene glycol diacrylate. Other photosensitive materials which can be used in such systems are the addition products obtained by reacting multifunctional isocyanate compounds with ethylenically unsaturated compounds containing a group containing an active hydrogen atom, such as a hydroxyl group or carboxylic acid group. Examples of isocyanates include hexamethylene di-isocyanate, tolylene di-isocyanate or isophorone di-isocyanate, or dimers or trimers formed thereform. Suitable unsaturated compounds containing an active hydrogen include, for example hydroxyethyl acrylate, hydroxylethyl methacrylate, acrylic acid and methacrylic acid.

A further class of UV sensitive curable materials are those formed by the reaction of epoxy compounds (so-called "epoxy resins") with ethylenically unsaturated acids such as acrylic acid or methacrylic acid; which reaction products may simply be termed "epoxy acrylactes"). The epoxy compound may be a simple glycidyl ether such as ethylene glycol diglycidyl ether or phenyl glycidyl ether; biphenol A/epichlorohydrin adducts such as those sold under the trade name Epitoke 828 (Shell Chemicals) or Quatrex 1010 (Dow Chemicals) or epoxy novolak resins such as Quatrex 2010 (Dow Chemicals). Epoxy acrylates may be further reacted with aliphatic dicarboxylic acids (commonly in the form of their anhydrides) to produce carboxylated products which are water-soluble or water-dispersible and may thus be "developed" using aqueous alkaline solutions (as described for example, in EP-A-0408629). Further ethylenically unsaturated materials are polyester acrylates and polyurethane acrylate resins.

In the second general class of photocurable system there will also generally be present photoinitiator, e.g. an organic ketone such as anthroquinone or the commerically available compounds sold under the trade name Irgacure 651 or Irgacure 907 (Ciba-Geigy). Such initiators may also be used in photocurable systems of the first general class described above in order to improve curing characteristics.

In the case of the second general class of photocurable material appropriate surfactants/emuisifing agents may be used to emulsify water insoluble components. A convenient method of forming an emulsion using a surfactant/emulsifying agent comprises mixing a concentrated solution (i.e. containing 50 to 80% by weight of solids) of the curable material in an appropriate organic solvent (such as a glycolether ester such as isopropyl cellolsolveacetate) with water and an appropriate emulsion agent (e.g. a nonionic surfactant such as a polyethoxy-polypropoxy sorbitan laurate ester); and blending and emulsifying the mixture in a suitable means (e.g.a Silverson high speed stirrer) to produce an oil-in-water emulsion.

In the practice of the process of the invention, the emulsion may be applied to the substrate by any suitable coating process such as screen printing, curtain coating, electrostatic spraying, dip coating, roller coating, spin coating or spraying. The thickness of resist of resist applied will, of course, vary depending on the intended end use of the resist and the nature of the substrate to which it is employed; however resist thicknesses (dry film thicknesses) of 20 to 80 μm are generally employed. Because of the incompatibility between the dispersant continuous phase in an aqueous emulsion, it has been found that the drying times involved using aqueous emulsion resists are much lower than those (at a comparable temperature) of volatile organic solvent-based resist compositions. By the same token, lower drying temperatures may be used to give comparable drying times. Once dried, the resist gives a hard, tack-free surface suitable for direct photoimaging at discussed above. The desired pattern may be developed using water.

In order to give a more permanent resist coating, for example one suitable for a solder resist, the composition may be finally thermally cured at an elevated temperature (suitably above the initial drying temperature e.g. at to 120°–150° C.). If necessary this may be followed by a final UV curing step.

In order that the invention may be well understood the following examples are given by way of illustration only. In the examples all percentages are by weight unless otherwise stated.

EXAMPLE 1

An emulsion comprising the following ingredients was prepared by high speed stirring.

| | |
|---|---|
| Polyvinyl alcohol | 7.61% |
| Polyvinyl acetate | 21.15% |
| Deionised water | 66.24% |
| Flow aid | 0.1% |
| Imperion blue | 0.6% |
| Diazo sensiter | 0.5% |
| wetting agent | 0.16% |

A layer of the above emulsion was applied to a printed circuit board using a No. 9 Q-bar draw down bar. The board was dried at 40° C. for 10 minutes to produce a tack-free film having a dry film thickness of about 40 μm. The dried coating was then exposed to ultraviolet light at a rate of 800 m.J/cm². The pattern thus produced was developed by brushing with tap water. Once developed, the film was firmly cured by baking at 140° C. for one hour. The resultant film was fluxed with Fry's No. 8 flux and soldered over a wave soldering machine containing solder to 0° C. The film showed good solder resistance and no solder pick up. Its adhesion was good and its solvent rubb resistance was acceptable.

EXAMPLE 2

An emulsion comprising the following materials was produced by high speed stirring.

| | |
|---|---|
| Polyvinyl alcohol | 14.13% |
| Polyvinyl acetate | 25.73% |
| Deionised water | 59.1% |
| Flow aid | 0.16% |
| Phthalocyanine Green | 0.18% |
| Diazo sensitiser | 0.5% |
| Wetting agent | 0.18% |

The emulsion was coated on to a printed circuit board using a curtain coating maching to give a dry resist film of 55 μm. The wet film was dried in an oven at 40° C. for ten minutes and then exposed to radiation of 600 mJ/cm² using a 6 Kw metal halide lamp producing UV light in the 300–360 nm range. The hardened pattern thus obtained was developed by brushing with tap water at ambient temperature. The resist was then firmly cured by baking at 150° C.

for one hour before being given a final cure of 1200 MJ/cm² using mercury halide lamps (80–120 w/cm). The fully cured film showed excellent resistance to solder at 280° C., as well as good resistance to solvent and the adhesion tests commonly used in the PCB art.

EXAMPLE 3

The UV-sensitive curable material used in this Example was a carboxylated epoxy acrylate derived from an epoxy cresol novolak, having an epoxy equivalent weight of 190–230, an equimolar amount of acrylic acid and sufficient tetrahydrophthalic anhydride to give a resin having an acid number of 70 mg KOH/g. This carboxylated epoxy acrylate was the employed in the form of a 60% solution in isopropyl cellosolve acetate.

A mixture comprising:

| | |
|---|---|
| Carboxylated epoxy acylate solution | 39.5% |
| Surfactant (Atlas G1350) | 4.00% |
| Pigment concentrate (phthalocyanine green) | 3.00% |
| Flow aid | 0.1% |
| Photoinitiator (Xanthone ITX) | 0.5% |
| Photoinitiator (Irgacure 907) | 1.9% |
| Distilled Water | 51.00% | was stirred with Silverson high speed stirrer for half an hour to produce an oil-in-water emulsion.

The light green disperson was screen printed through a 49T polyester screen onto a standard IPL solder resist test board. The film was dried to a tack finish and then oven dried at 100° C. to give a dry film coat about 20 mµ thick. The film was then imagewise exposed to UV light and developed using 5% w/w sodium carbonate solution at 38° C. The film was then post-baked at 140° C. for one and a half hours and then given a final UV cure. The fully cured film displayed an accurate reproduction of the art work, resisted a 10 second dip in molten solder without damage, and passed the IPL 5M40A class III hydrolytic ageing test.

EXAMPLE 4

The carboxylated epoxy acrylate solution as used in Example 3 was used together with a 60% solution, in propylene glycol methyl ether acetate, of a carboxylated epoxy acrylate derived from an epoxy novolak resin, having an epoxy equivalent weight of from 175 to 210, an equimolar amount of acrylic acid and sufficient maleic anhydride to give a resin having an acid value of 50 mg KOH/gm.

The following mixture was stirred for half an hour in a Silverson high speed stirrer to produce an oil-in-water emulsion:

| | |
|---|---|
| Carboxylated epoxy acrylate solution in Example 3 | 17.84% |
| Carboxylated epoxy acrylate solution as described above | 41.62% |
| Dye (Methylene blue) | 0.85% |
| Photoinitiator (xanthone ITX) | |
| photoinitiator (Iracure 907) | 3.39% |
| Flow aid | 0.02% |
| Ditrimethylol propane tetraacrylate | 7.58% |
| Distilled water | 20.00% |
| Surfactant (Atlas G1350) | 7.06% |

The light blue dispersion was coated at a precleaned copper panel using a pneumatic spray gun (Binks Bullows 230). The net film was dried at 80° C. for half an hour to give a tack-free film 12 mµ thick. The film was then imagewise exposed through etch resist artwork and developed in 0.6% w/w sodium carbonate solution at 37° C. to give a faithful reproduction of the artwork pattern. The developed film was then post-dried in an oven at 110° C. for 20 minutes and then etched in a solution of acid ferric chloride. The resist was then stripped from the circuit using 5% w/w sodium hydroxide solution at 55° C. to give a patterned copper layer faithful to the original artwork and free of shorts, breaks or mouse-bites.

We claim:

1. A circuit board having solder resist and solder applied thereto formed by the steps of:
   (i) forming a solder resist layer capable of withstanding soldering, said solder resist layer formed by a process chosen from the group of processes consisting of screen printing, curtain coating, electrostatic spraying, dip coating, roller coating, spin coating and spraying, said solder resist consisting essentially of an aqueous emulsion of a photocurable organic solvent solution of an epoxy acrylate derived from an epoxy novalak resin selected from the group of resins consisting of resins produced by reacting ethylenically unsaturated carboxylic acid and polyepoxy compound, and resins produced by reacting ethylenically unsaturated carboxylic acid, polyepoxy compound and dicarboxylic anhydride, upon substantially the entire surface of the board;
   (ii) drying the solder resist layer to a non-tacky state by removing said organic solvent and water of said aqueous emulsion;
   (iii) imagewise exposing the solder resist layer to radiation to cure portions of the solder resist layer exposed to the radiation;
   (iv) removing portions of the solder resist layer which are unexposed, and thereby uncured, by washing with an aqueous solution of an alkali, thereby leaving said cured portions to form a patterned solder resist;
   (v) completely drying the patterned resist layer; and
   (vi) applying solder to the circuit board, thereby soldering connections left exposed after portions of the solder resist are removed.

2. A circuit board having solder resist and solder applied thereto formed by the steps of:
   (i) applying, over substantially all of the surface of said circuit board, a solder resist layer by a process chosen from the group of processes consisting of screen printing, curtain coating, electrostatic spraying, dip coating, roller coating, spin coating and spraying, said solder resist being capable of withstanding soldering and comprising an aqueous emulsion of organic solvent solution of a photocurable ethylenically unsaturated carboxylated epoxy acrylate essentially derived from the reaction of:
      (a) an epoxy novolak resin;
      (b) an ethylenically unsaturated carboxylic acid, and
      (c) an anhydride of a dicarboxylic acid;
   (ii) drying the solder resist layer to a non-tacky state;
   (iii) imagewise exposing the solder resist layer to radiation to cure portions of the solder resist layer exposed to the radiation;
   (iv) removing portions of the solder resist layer which are unexposed, and thereby uncured, by washing with an aqueous solution of an alkali, thereby leaving said portions to form a patterned solder resist;
   (v) completely drying the patterned solder resist layer; and
   (vi) applying solder to the circuit board, thereby soldering connections left exposed after portions of the solder resist layer are removed.

* * * * *